US009680281B2

(12) United States Patent
Xuan et al.

(10) Patent No.: US 9,680,281 B2
(45) Date of Patent: Jun. 13, 2017

(54) LASER SYSTEM HAVING SWITCHABLE POWER MODES

(71) Applicant: Boston Scientific Scimed, Inc., Maple Grove, MN (US)

(72) Inventors: Rongwei Jason Xuan, Fremont, CA (US); Michael R. Hodel, Fremont, CA (US); Douglas G. Stinson, Fremont, CA (US); Raymond Adam Nemeyer, Cupertino, CA (US)

(73) Assignee: Boston Scientific Scimed, Inc., Maple Grove, MN (US)

( * ) Notice: Subject to any disclaimer, the term of this patent is extended or adjusted under 35 U.S.C. 154(b) by 0 days.

(21) Appl. No.: 14/620,681

(22) Filed: Feb. 12, 2015

(65) Prior Publication Data

US 2015/0263480 A1    Sep. 17, 2015

Related U.S. Application Data

(63) Continuation of application No. 13/061,594, filed as application No. PCT/US2009/056193 on Sep. 8, 2009, now abandoned.
(Continued)

(51) Int. Cl.
*H01S 3/0941* (2006.01)
*H01S 3/094* (2006.01)
(Continued)

(52) U.S. Cl.
CPC ........ *H01S 3/094076* (2013.01); *H01S 3/061* (2013.01); *H01S 3/0941* (2013.01);
(Continued)

(58) Field of Classification Search
CPC .... H01S 3/0912; H01S 3/0941; H01S 3/1022; H01S 3/1312
(Continued)

(56) References Cited

U.S. PATENT DOCUMENTS 4,575,854 A    3/1986 Martin
4,907,235 A    3/1990 Kuizenga
(Continued)

FOREIGN PATENT DOCUMENTS

DE    19702146 A1    7/1997
DE    19723269 A1    12/1998
(Continued)

OTHER PUBLICATIONS

Bi, Yong et al., "Configuration to improve second-harmonic-generation conversion efficiency," Applied Optics, Feb. 10, 2004, vol. 43 No. 5, pp. 1174-1179.
(Continued)

*Primary Examiner* — Tod T Van Roy
(74) *Attorney, Agent, or Firm* — Bookoff McAndrews, PLLC

(57) ABSTRACT

In a method, a laser pump module is set to a first power mode and pump energy is output at a first power level through the activation of a first subset of laser diodes. Laser light is emitted from a gain medium at the first power level in response to absorption of the pump energy. An operator input corresponding to a power mode setting is received. The laser pump module is switched to a second power mode and pump energy is output at a second power level through the activation of a second subset of the laser diodes. Laser light is emitted from the gain medium at the second power level in response to absorption of the pump energy.

19 Claims, 7 Drawing Sheets

Related U.S. Application Data

(60) Provisional application No. 61/094,462, filed on Sep. 5, 2008.

(51) Int. Cl.
*H01S 3/102* (2006.01)
*H01S 3/16* (2006.01)
*H01S 5/042* (2006.01)
*H01S 3/131* (2006.01)
*H01S 3/06* (2006.01)
*H01S 3/081* (2006.01)
*H01S 3/109* (2006.01)
*H01S 3/11* (2006.01)
*H01S 5/40* (2006.01)

(52) U.S. Cl.
CPC ........ *H01S 3/09415* (2013.01); *H01S 3/1022* (2013.01); *H01S 3/1312* (2013.01); *H01S 3/1611* (2013.01); *H01S 3/1643* (2013.01); *H01S 5/0428* (2013.01); *H01S 5/4025* (2013.01); *H01S 3/0612* (2013.01); *H01S 3/0817* (2013.01); *H01S 3/09408* (2013.01); *H01S 3/109* (2013.01); *H01S 3/11* (2013.01); *H01S 5/4018* (2013.01)

(58) Field of Classification Search
USPC ...................................................... 372/70, 75
See application file for complete search history.

(56) References Cited

U.S. PATENT DOCUMENTS

| | | | |
|---|---|---|---|
| 4,974,230 | A | 11/1990 | Hemmati |
| 5,022,043 | A | 6/1991 | Jacobs |
| 5,025,446 | A | 6/1991 | Kuizenga |
| 5,185,758 | A | 2/1993 | Fan et al. |
| 5,226,051 | A * | 7/1993 | Chan ........................ H01S 3/115 372/10 |
| 5,307,430 | A | 4/1994 | Beach et al. |
| 5,337,325 | A | 8/1994 | Hwang |
| 5,530,709 | A | 6/1996 | Waarts et al. |
| 5,638,397 | A | 6/1997 | Nighan, Jr. et al. |
| 5,689,522 | A | 11/1997 | Beach |
| 5,844,149 | A | 12/1998 | Akiyoshi et al. |
| 5,859,868 | A | 1/1999 | Kyusho |
| 5,907,570 | A | 5/1999 | Nighan et al. |
| 5,974,074 | A | 10/1999 | Mayor et al. |
| 6,026,101 | A | 2/2000 | Suzudo et al. |
| 6,069,907 | A | 5/2000 | Chang |
| 6,094,447 | A | 7/2000 | Drake, Jr. |
| 6,151,345 | A | 11/2000 | Gray |
| 6,185,236 | B1 | 2/2001 | Eichenholz et al. |
| 6,246,706 | B1 | 6/2001 | Kafka et al. |
| 6,266,358 | B1 | 7/2001 | Hollemann et al. |
| 6,347,101 | B1 | 2/2002 | Wu et al. |
| 6,356,574 | B1 * | 3/2002 | Craig ................ H01S 3/094003 372/50.1 |
| 6,366,596 | B1 | 4/2002 | Yin et al. |
| 6,407,535 | B1 | 6/2002 | Friedman et al. |
| 6,421,573 | B1 | 7/2002 | Kafka et al. |
| 6,483,858 | B1 | 11/2002 | Hovater et al. |
| 6,504,858 | B2 | 1/2003 | Cheng et al. |
| 6,570,902 | B2 | 5/2003 | Peressini |
| 6,661,568 | B2 | 12/2003 | Hollemann et al. |
| 6,671,305 | B2 | 12/2003 | Knights et al. |
| 6,898,231 | B2 | 5/2005 | Butterworth |
| 7,505,196 | B2 * | 3/2009 | Nati .................... H01S 3/06758 359/333 |
| 2005/0135452 | A1 | 6/2005 | Ishizu |
| 2005/0201429 | A1 | 9/2005 | Rice et al. |
| 2007/0098024 | A1 | 5/2007 | Mitchell |
| 2007/0185474 | A1 * | 8/2007 | Nahen .................... A61B 18/24 606/3 |
| 2008/0144690 | A1 | 6/2008 | Mitchell |
| 2011/0164649 | A1 | 7/2011 | Xuan et al. |

FOREIGN PATENT DOCUMENTS

| | | |
|---|---|---|
| EP | 0814550 A2 | 12/1997 |
| EP | 0849894 A1 | 6/1998 |
| EP | 1 026 795 | 8/2000 |
| EP | 1923971 A1 | 5/2008 |
| JP | 02-80062 | 3/1990 |
| JP | 11-243245 | 9/1999 |
| JP | 2000223765 | 8/2000 |
| WO | 2010028346 A1 | 3/2010 |

OTHER PUBLICATIONS

Honea, Eric C., et al., "115-W Tm:YAG Diode-Pumped Solid-State Laser," IEEE Journal of Quantum Electronics, Sep. 1997, vol. 33 No. 9, pp. 1592-1600.
Honea, Eric C., et al., "Analysis of an intracavity-doubled diode-pumpted Q-switched Nd:YAG laser producing more than 100 W of power at 0.532 μm," Optical Letters, Aug. 1, 1998, vol. 23 No. 15, pp. 1203-1205.
Kasamatsu, Tadashi et al., "Laser-diode-pumped Nd:YAG active-mirror laser," Applied Optics, Mar. 20, 1997, vol. 36, No. 9, pp. 1879-1881.
Lai, K.S. et al., "120-W continuous-wave diode-pumped Tm:YAG laser," Optics Letters, Nov. 1, 2000, vol. 25 No. 21, pp. 1591-1593.
Lin, Guo et al., "Diode-end-pumped passively mode-locked ceramic Nd:YAG Laser with a semiconductor saturable mirror," Optics Express, May 30, 2005, vol. 13 No. 11, pp. 4085-4089.
Liu, Qiang et al., "520-W continuous-wave diode corner-pumped composite Yb:YAG slab laser," Optics Letters, Apr. 1, 2005, vol. 30 No. 7, pp. 726-728.
Saint-Gobain Crystals "Nd:YAG Neodymium-Doped YAG Laser Crystals." 2004, 2 pages.
Paschotta, R., et al., "Diode-pumped passively mode-locked lasers with high average power," Appl. Phys. B., May 24, 2000, 70 [Suppl.], pp. S25-S31.
Schiehlen, Eckart, et al., "Diode-Pumped Semiconductor Disk Laser With Intracavity Frequency Doubling Using Lithium Triborate (LBO)," IEEE Photonics Technology Letters, Jun. 2002, vol. 14 No. 6, pp. 777-779.
Mingxin, Qiu et al., "Performance of a Nd:YVO4 microchip laser with continuous-wave pumping at wavelengths between 741 and 825 nm," Applied Optics, Apr. 20, 1993, vol. 32 No. 12, pp. 2085-2086.
Martel, G. et al., "Experimental and theoretical evidence of pump-saturation effects in low power end-pumped Nd: YVO4 microchip laser," Optics Communications, Sep. 28, 2000, vol. 185, pp. 419-430.
Tsunekane, M., "High power operation of diode-end pumped Nd:YVO4 laser using composite rod with undoped end," Electronic Letters, Jan. 4, 2005, vol. 32 No. 1, pp. 40-42.
Hardman, P.J., "Energy-Transfer Upconversion and Thermal Lensing in High-Power End-Pumped Nd:YLF Laser Crystals," IEEE Journal Quantum Electronics, Apr. 4, 1999, vol. 35 No. 4, pp. 647-655.
Pollnau, M., "Upconversion-induced heat generation and thermal lensing in Nd:YLF and Nd: YAG," Physical Review B, Dec. 15, 1998, vol. 58 No. 24, pp. 076-091.
Office Action from Japan Patent Office for Japanese Patent Application No. 2011-526267, dated Feb. 26, 2013.
International Preliminary Report on Patentability of PCT/US2009/056193, mailed Aug. 27, 2010.
Examiner Requisition from related Canadian Patent Application No. 2,736,312, dated May 31, 2013.
International Search Report and Written Opinion of PCT/US2009/056193, filed Sep. 8, 2009.
Prosecution History of U.S. Appl. No. 11/261,010, filed Oct. 28, 2005.

(56) References Cited

OTHER PUBLICATIONS

Xu, Degang et al. "104 W high stability green laser generation by using diode laser pumped intracavity frequency-doubling Q-switched composite ceramic Nd:YAG laser", Apr. 2, 2007, pp. 3391-3397, vol. 15, No. 7, Optics Express.
Examiner's Decision of Refusal from Japanese Patent Application No. 2011-526267, mailed Aug. 13, 2013.
Prosecution History of U.S. Appl. No. 13/061,594, filed Mar. 1, 2011, including: Advisory Action mailed Sep. 30, 2014; Final Rejection mailed Aug. 15, 2014; Non-Final Rejection mailed Apr. 2, 2014; Advisory Action mailed Jan. 23, 2013; Final Rejection mailed Dec. 7, 2012; and Non-Final Rejection mailed Jul. 27, 2012.

\* cited by examiner

LASER SYSTEM HAVING SWITCHABLE POWER MODES

CROSS-REFERENCE TO RELATED APPLICATION

This Application is a continuation of U.S. application Ser. No. 13/061,594, filed Mar. 1, 2011, which is a Section 371 National Stage Application of International Application No. PCT/US2009/056193, filed Sep. 8, 2009 and published as WO 2010/028346 A1 on Mar. 11, 2010, in English, which in turn is based on and claims the benefit of U.S. Provisional Application Ser. No. 61/094,462, filed Sep. 5, 2008 under 35 U.S.C. §119(e). The content of each of the above-identified applications are hereby incorporated by reference in their entirety.

BACKGROUND OF THE INVENTION

Embodiments of the invention are directed to a laser system having switchable power modes. Other embodiments are directed to a method of operating the laser system using a laser pump module having switchable power modes.

High power laser systems have a broad range of applications throughout the scientific, industrial and medical fields. Laser systems generally include a pump module, a gain medium and a laser resonator. The pump module includes laser diodes or bars that generate pump energy. The gain medium absorbs the pump energy and emits laser light responsive to the absorbed energy. The laser resonator operates to generate a harmonic of the laser light.

The pump energy can be applied to the gain medium from the side of the gain medium, known as side-pumping, or from the end of the gain medium, known as end-pumping. Side-pumping is relatively inefficient; so that the conversion of pump energy into laser output is low at relatively high pump energies. End-pumping is more efficient. However, an upper limit is quickly reached for end-pumped gain media, where rapid absorption of pump energy in a small volume within the first few millimeters of the gain media causes thermal fracture.

The gain medium is generally tuned to absorb pump energy having a wavelength that is within a specified operating band. Thus, the wavelength of the pump energy must be carefully controlled to ensure proper operation of the laser system.

The wavelength of the pump energy varies with a temperature of the laser diodes and the current supplied to the laser diodes. Such fluctuations in the wavelength of the pump energy can be readily controlled when the pump energy is operated at a continuous power level and sufficient time is allowed for the system to reach a steady-state temperature. However, some applications of laser systems desire multiple power laser output modes and the ability to rapidly switch among the power output modes while maintaining the excellent pump absorption efficiency at all power modes. Such rapid switching between different power output modes by varying the pump current can cause the pump energy to stray outside the operating band of the gain medium causing low pump energy to lasing energy conversion efficiency, which can potentially damage the pump source by unabsorbed pump energy.

SUMMARY OF THE INVENTION

Embodiments of the invention are directed to a pump module, a laser system and methods of operating a pump module and laser system. One embodiment of the pump module is configured to output pump energy at multiple power levels. The pump module comprises a power source, a plurality of laser diodes, a controller and light combining optics. The laser diodes each have an activated state and a deactivated state. The laser diodes receive current from the power source and output light when in the activated state and do not receive current from the power source when in the deactivated state. The controller switches the plurality of laser diodes from a first power mode, in which a first subset of the laser diodes is in the activated state, to a second power mode, in which a second subset of the laser diodes is in the activated state, responsive to a power mode setting. The light combining optics are configured to combine the light from the activated laser diodes and output the combined light as pump energy.

One embodiment of the laser system comprises a pump module and a gain medium. The pump module is configured to output pump energy having a wavelength that is within a wavelength range of 874-881 nm at the first and second power levels. The gain medium is in the path of the pump energy and is configured to absorb the pump energy and emit laser light responsive to the absorbed pump energy. In one embodiment, system includes a controller and the pump module is configured to output the pump energy at first and second power levels. The controller switches the power level of the pump energy between the first and second power levels responsive to a power mode setting input from an operator.

In one of the methods, a laser pump module is provided that is configured to output pump energy at first and second power levels. In one embodiment, the wavelength of the pump energy is within a wavelength range of 874-881 nm at the first and second power levels. A gain medium is provided in the path of the pump energy and a controller is provided. Pump energy is produced at the first power level. Laser light is emitted from the gain medium at a first power level responsive to absorption of the pump energy. A power mode setting is received from an operator. The power level of the pump energy is switched from the first power level to the second power level responsive to the power mode setting using the controller. Laser light is emitted from the gain medium at a second power level responsive to the absorption of the pump energy.

DETAILED DESCRIPTION OF ILLUSTRATIVE EMBODIMENTS

Figure 1:
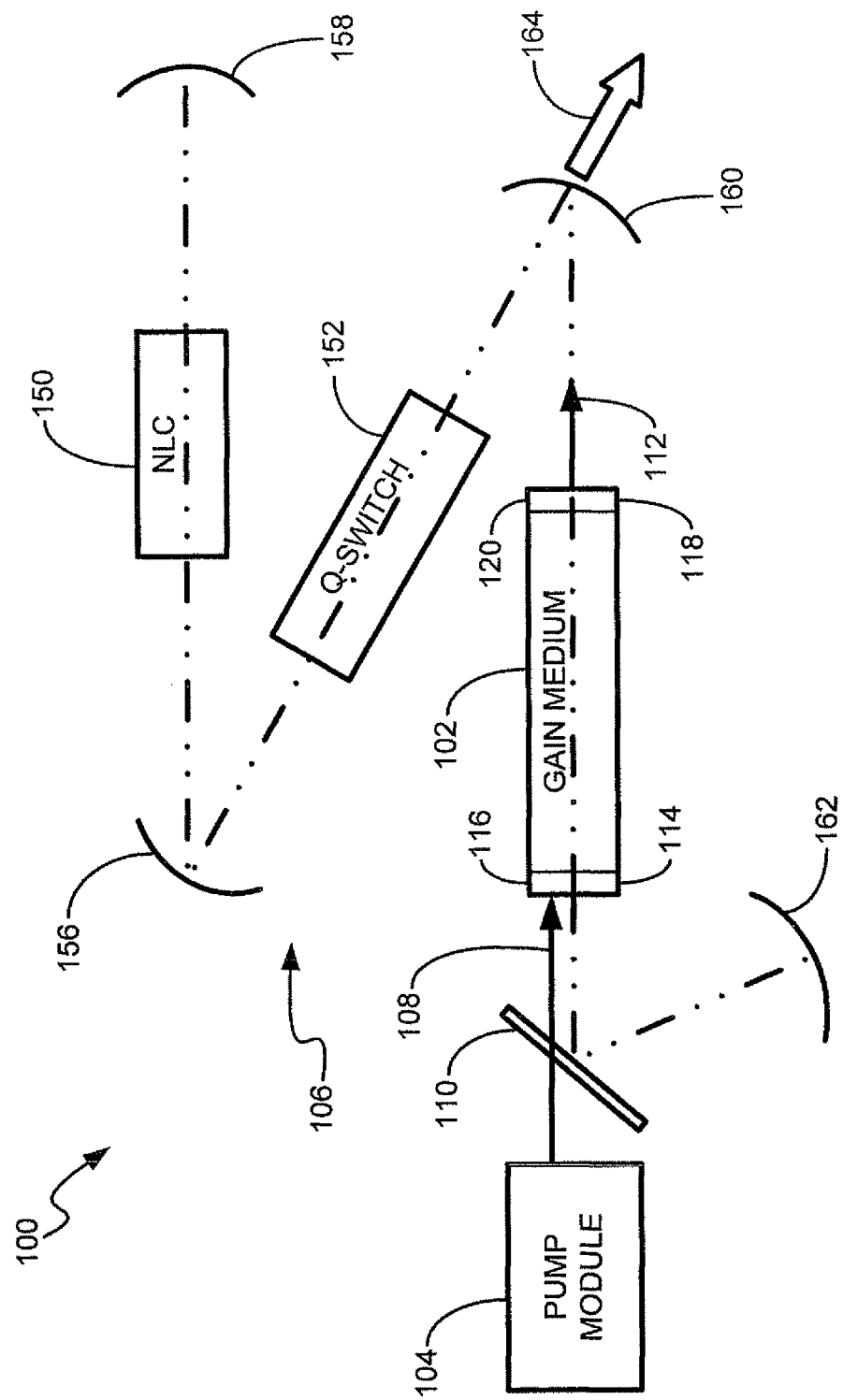
FIG. 1 illustrates a high-power laser system in accordance with embodiments of the invention.

FIG. 1 illustrates a high-power laser system 100 in accordance with embodiments of the invention. The laser system 100 includes a gain medium 102, a pump module 104 and a laser resonator 106. In one embodiment, the gain medium 102 is a doped crystalline host that is configured to absorb pump energy 108 generated by the pump module 104 having a wavelength that is within an operating wavelength (i.e., absorption spectra) range of the gain medium 102. In one embodiment, the gain medium 102 is end-pumped by the pump energy 108, which is transmitted through a folding mirror 110 that is transmissive at the wavelength of the pump energy 108. The gain medium 102 absorbs the pump energy 108 and responsively outputs laser light 112.

The gain medium 102 is water cooled in exemplary embodiments, along the sides of the host. In one embodiment, the gain medium 102 includes an undoped end cap 114 bonded on a first end 116 of the gain medium 102, and an undoped end cap 118 bonded on a second end 120 of the gain medium 102. In one embodiment, the end 120 is coated so that it is reflective at the pump energy wavelength, while transmissive at a resonant mode of the system 100. In this manner, the pump energy that is unabsorbed at the second end 120 is redirected back through the gain medium 102 to be absorbed.

Figure 2:
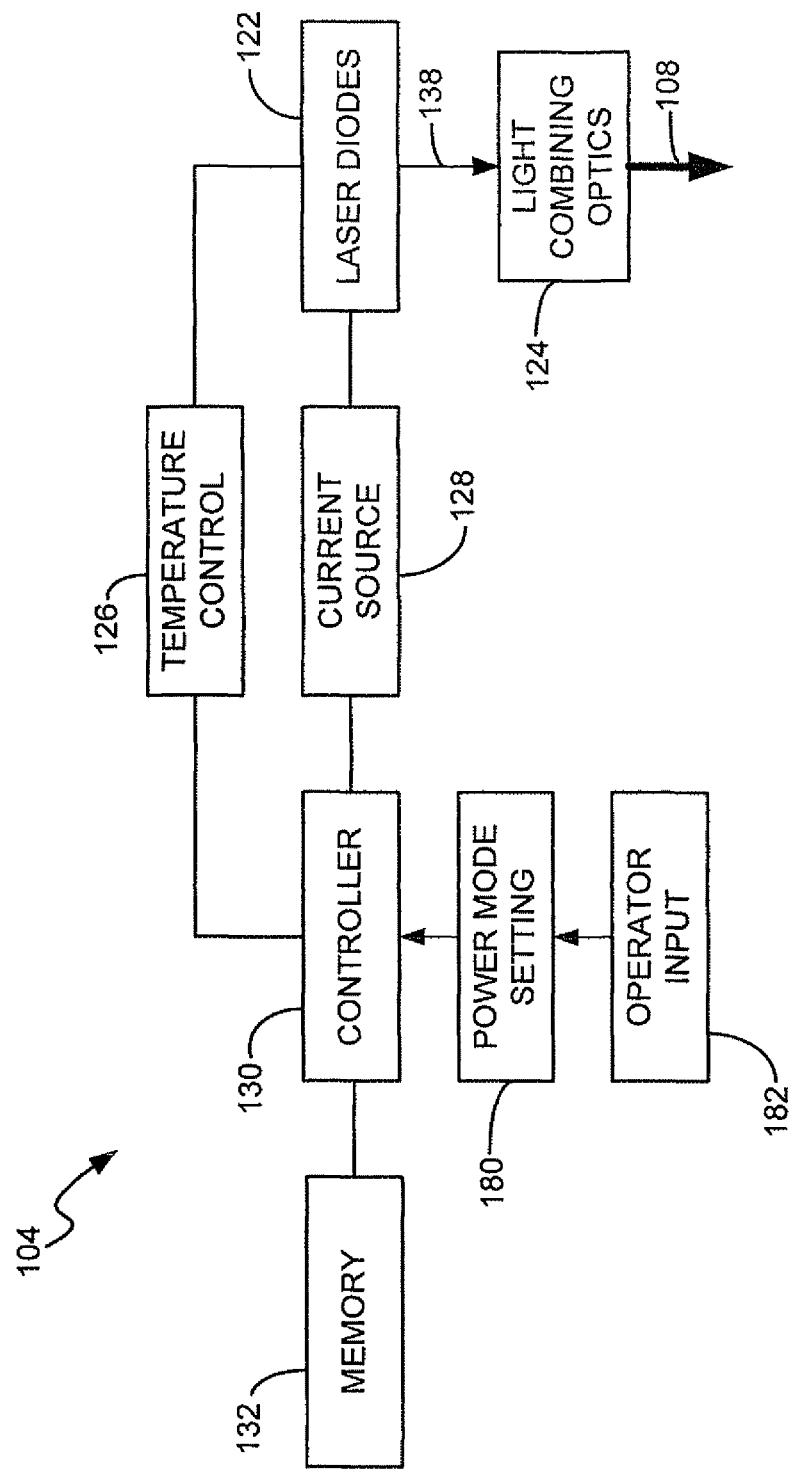
FIG. 2 is a simplified block diagram of a pump module in accordance with embodiments of the invention.

The pump module 104 produces the pump energy 108 within an operating wavelength range of the gain medium 102. One embodiment of the laser pump module 104 includes a plurality of laser diodes or bars 122 (hereinafter "laser diodes"), light combining optics 124, a temperature control system 126, a current or power source 128, and a controller 130, as shown in the simplified block diagram of FIG. 2. The plurality of laser diodes 122 operate to produce the pump energy 108. In one embodiment, the laser diodes 122 are arranged in an array, such as a multiple bar stack of laser diodes 122.

In one embodiment, the controller 130 controls the temperature control system 126 to maintain the laser diodes 122 at a desired operating temperature such that the pump energy 108 is within the operating wavelength range of the gain medium 102, at which the pump energy 108 is efficiently absorbed. In another embodiment, the controller 130 controls the current source 128 to control the current to the laser diodes 122.

One embodiment of the controller 130 includes one or more processors. In accordance with another embodiment, the controller 130 includes memory 132 that contains instructions executable by the one or more processors to perform various functions, such as, for example, controlling the current to the laser diodes 122 from the current or power source 128 to control the power level of the pump energy 108, and controlling the temperature control system 126 to maintain the temperature of the laser diodes 122 at an operating temperature, at which the pump energy 108 at a given power level is within the operating wavelength range of the gain medium 102.

The light combining optics 124 are configured to combine the light from the laser diodes 122 and output the combined light as the pump energy 108. Embodiments of the light combining optics 124 may comprise a collimation lens, a polarization multiplexer, a brightness doubler, beam shape optics and focusing lenses that focus the pump energy 108 near the first end of the gain medium 102, and/or other optical components.

Figure 3:
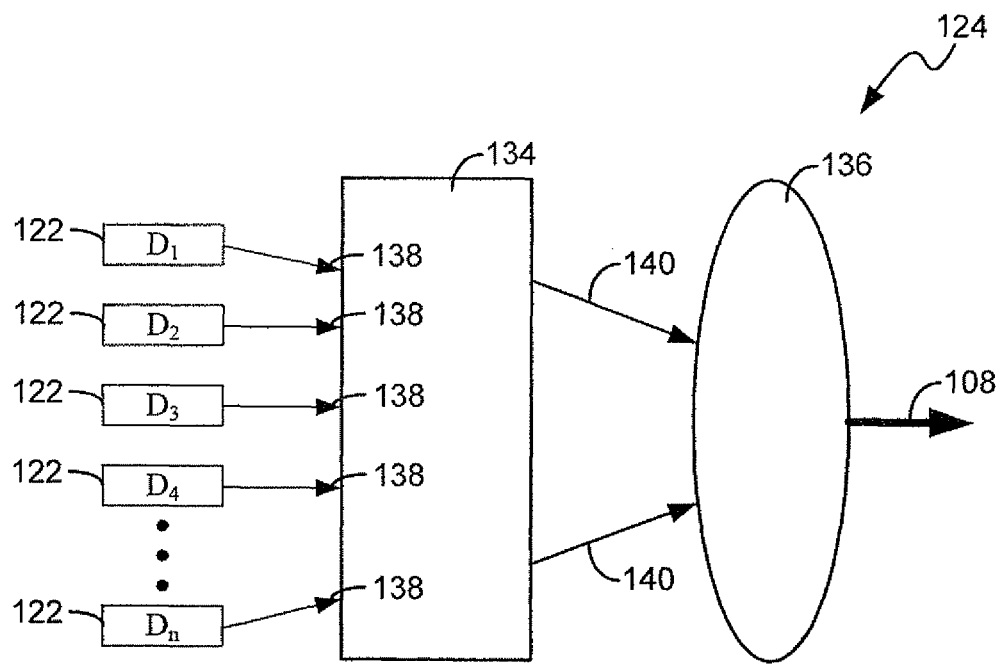
FIGS. 3 and 4 are simplified diagrams of optical components of a pump module in accordance with embodiments of the invention.
Figure 4:
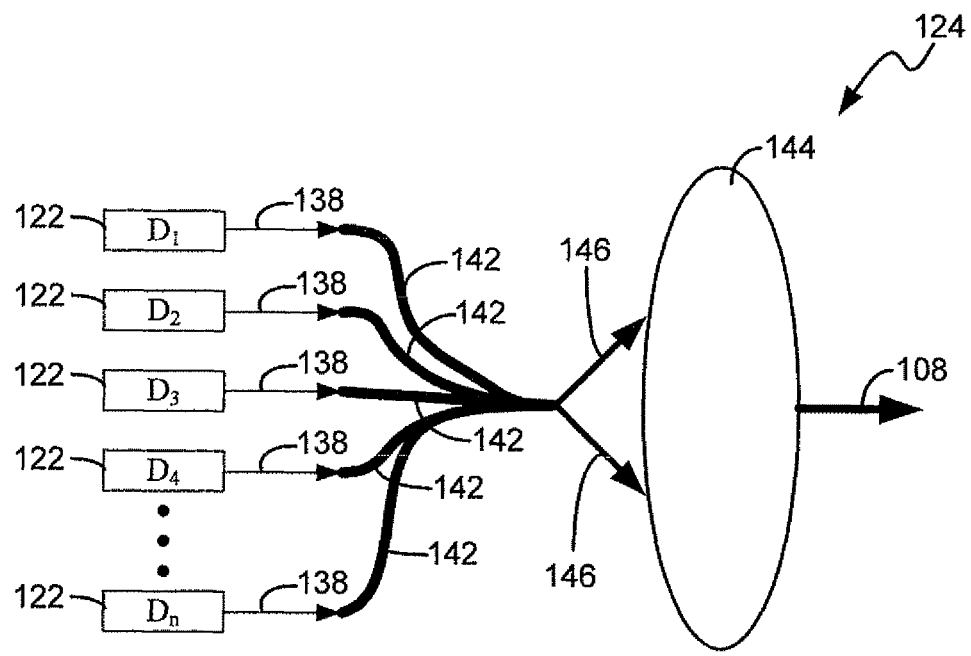

FIGS. 3 and 4 are simplified diagrams of optical components of the pump module 104 in accordance with embodiments of the invention. In one embodiment, the light combining optics 124 comprise light combining and homogenizing optics 134 and collimation and beam shape optics 136, as shown in FIG. 3. The combining and homogenizing optics 134 combine the light output 138 from the plurality of laser diodes or diode bars 122 (individually labeled $D_1$, $D_2$, $D_3$ . . . $D_a$), as shown in FIG. 3. The output 140 from the combining and homogenizing optics 134 is provided to the collimation and beam shape optics 136, which convert the combined and homogenized output 140 into the pump energy 108 that is directed to the gain medium 102.

In accordance with another embodiment, the light combining optics 124 comprise a plurality of optical fibers 142 and a combiner 144, as illustrated in FIG. 4. Each of the plurality of optical fibers 142 is configured to transmit the light 138 output from one of the laser diodes 122. The combiner 144 is configured to receive the light 146 from the laser diodes 122 that is transmitted by the plurality of optical fibers 142 and combine the transmitted light 146 into the pump energy 108, which is directed to the gain medium 102. Beam shape optics and other elements necessary to shape and focus the pump energy 108 may be used in accordance with conventional techniques.

The laser resonator 106 is configured to generate a harmonic of the laser light 112 output from the gain medium 102. In one embodiment, the laser resonator 106 includes a non-linear crystal (NLC) 150, such as a lithium borate (LBO) crystal or a potassium titanyl phosphate crystal (KTP), for generating a second harmonic of the laser beam 112 emitted by the gain medium 102.

In one embodiment, the gain medium 102 comprises a yttrium-aluminum-garnet crystal (YAG) rod with neodymium atoms dispersed in the YAG rod to form a Nd:YAG gain medium 102. The Nd:YAG gain medium 102 converts the pump light into the laser light 112 having a primary wavelength of 1064 nm. The laser resonator 106 generates the second harmonic of the 1064 nm laser light 164 having a wavelength of 532 nm. One advantage of the 532 nm wavelength is that it is strongly absorbed by hemoglobin in blood and, therefore, is useful in medical procedures to cut, vaporize and coagulate vascular tissue.

In one embodiment, the laser resonator 106 includes a Q-switch 152 that operates to change the laser beam 112 into a train of short pulses with high peak power to increase the conversion efficiency of the second harmonic laser beam.

The laser resonator 106 also includes reflecting mirrors 156, 158 and 162, folding mirror 110, and output coupler 160. The mirrors 110, 156, 158 and 162, and output coupler 160 are highly reflective at the primary wavelength (e.g., 1064 nm). The output coupler 160 is highly transmissive at the second harmonic output wavelength (e.g., 532 nm). The primary wavelength laser beam (e.g., 1064 nm) inside the resonator 106 bounces back and forth along the path between the mirrors 158 and 162, passing through the gain medium 102 and the non-linear crystal 150 to be frequency doubled to the second harmonic output wavelength (e.g., 532 nm) beam, which is discharged through output coupler 160 as the output laser 164. The Z-shaped resonant cavity can be configured as discussed in U.S. Pat. No. 5,025,446 by Kuizenga, imaging the resonant mode at one end of the gain medium 102 at the non-linear crystal 150. The configuration described is stable and highly efficient for frequency conversion. The configuration shown in FIG. 1 using the Nd:YAG gain medium 102 and a LBO non-linear crystal 150 produces a frequency converted output laser 164 having a wavelength of 532 nm, as indicated above.

In one embodiment, the laser system 100 includes multiple power levels for the output laser 112, which produces multiple power levels of the output laser 164, by adjusting the power level of the pump energy 108 output from the pump module 104 using the controller 130. In one embodiment, the power levels of the output laser beam 164 extend over a wide range, such as 10 W-200 W, for example. In one embodiment, the pump module 104 is configured to quickly switch between two or more power levels, as discussed below in greater detail.

The power changes of the pump module 104 due to changes in the current to the laser diodes 122 change the operating temperature (i.e., junction temperature) of the laser diodes 122, which in turn causes a change in the wavelength of the pump energy 108. When the operating wavelength range of the gain medium 102 is narrow (e.g., 1-2 nm), such pump module power changes can cause the pump energy 108 wavelength to shift outside of the operating wavelength range of the gain medium 102. In such a circumstance, the desired laser output 164 of the system 100 may be delayed until the temperature control system 126 returns the laser diodes 122 to the operating temperature at which the pump energy wavelength falls within the operating wavelength of the gain medium 102.

In one embodiment, the operating wavelength range of the gain medium 102 is selected to be tolerant to such wavelength shifts over the power range of the pump energy 108. That is, the gain medium 102 is configured to maintain a high absorption efficiency over the wavelengths of the pump energy 108 output during the desired power level changes of the pump module 104. This allows the gain medium 102 to maintain a high pump energy 108 to lasing light 112 conversion efficiency during fast (e.g., less than one second) pump energy 108 level changes, such as those described below.

The efficiency at which the gain medium 102 converts the pump energy 108 into laser light 112 depends on the absorption efficiency of the gain medium 102 at the wavelength of the pump energy 108. The absorption efficiency at which the gain medium 102 absorbs the pump energy 108 varies with wavelength and is dependent on the dopant (e.g., neodymium atoms), the doping concentration and the length of the gain medium 102.

Figure 5:
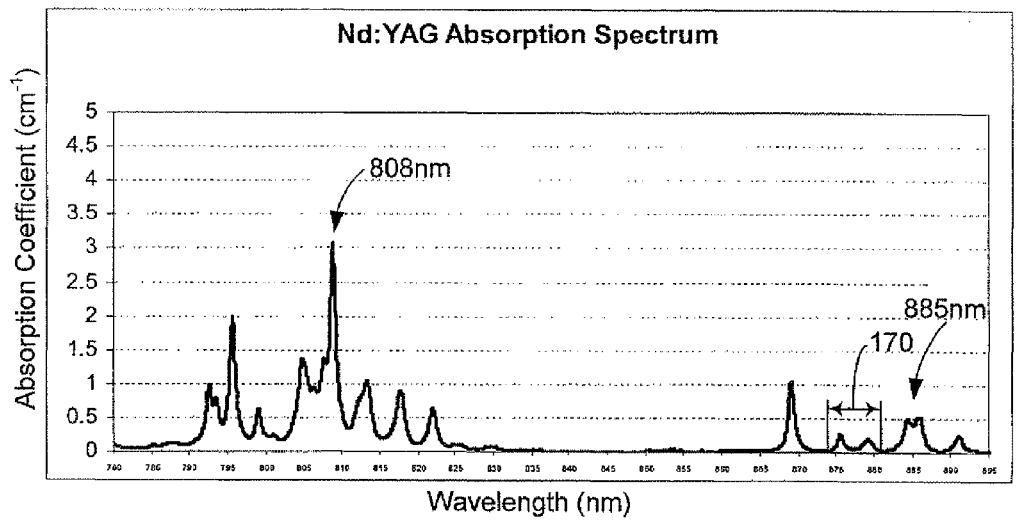
FIGS. 5 and 6 are charts illustrating the absorption coefficient of a Nd:YAG gain medium versus pump energy wavelength.

FIG. 5 shows the absorption coefficient ($cm^{-1}$) (y-axis) of the gain medium 102 versus pump energy wavelength (x-axis) over practical range of wavelengths for a Nd:YAG gain medium. The absorption coefficient includes peaks and valleys over the range of pump energy wavelengths. One conventional practice is to utilize one of the narrow operating wavelength bands at one of the peaks of the absorption coefficient curve, such as at 808 nm or 885 nm, to maximize the absorption efficiency of pump light 108 by the shorter gain medium 102 to reduce the cost and have compact resonator design. However, in addition to thermal distortion problems, such narrow operating wavelength bands are intolerant to wavelength shifts of the pump energy 108 caused by, for example, power changes in the pump energy 108 by varying the pump current.

It is also desirable to select an operating wavelength range for the gain medium 102 that is closer to a harmonic of the gain medium 102, such as 1064 nm for the Nd:YAG gain medium 102. The closer you are to the harmonic, the more efficient the pump energy 108 to laser conversion. However, the selection of the operating wavelength range for the gain medium 102 is limited to the capabilities of the available laser diodes 122 and the cost of the laser diodes 122.

Figure 6:
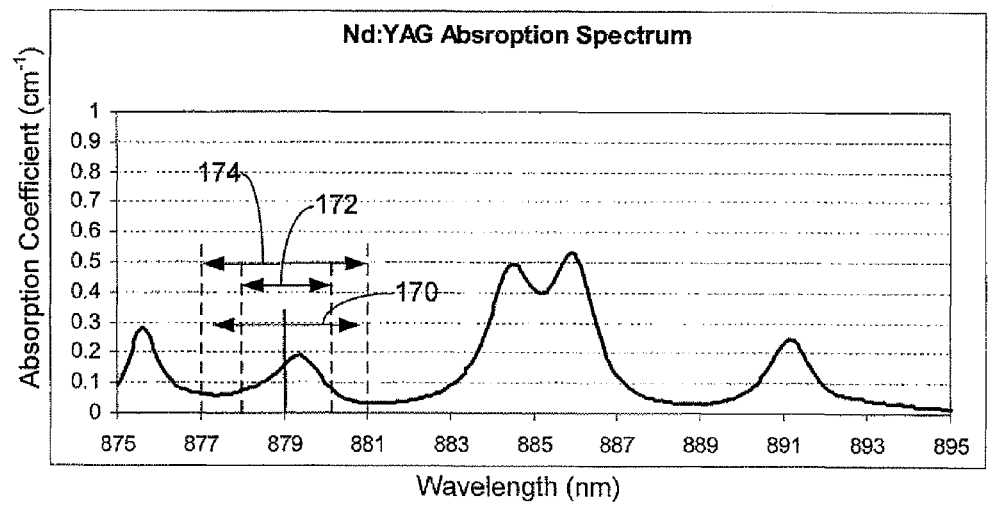

FIG. 6 shows the absorption coefficient of the Nd:YAG gain medium 102 versus pump energy wavelength over a wavelength range of 875-895 nm. In one embodiment, the pump module 104 is configured to output pump energy 108 at a wavelength around 879 nm and the gain medium 102 is configured to have an operating wavelength range covering the 879 nm wavelength. The 879 nm wavelength lies substantially off the peak at 885 nm and the absorption coefficient of the gain medium 102 at 879 nm is approximately less than about 25% of the absorption efficiency near 885 nm.

In one embodiment, the gain medium 102 is configured to have an operating wavelength range 170 that covers the range of pump energy wavelengths that are expected over a wide range of pump energy levels. Such an operating wavelength range eliminates the effect of pump energy wavelength shifts on the ability of the laser system 100 to produce the output laser 164 at the desired power level. Embodiments of the operating wavelength range 170 include ranges that cover shifts in the pump energy 108 wavelength of plus or minus 1.5 nm (172), 2 nm (174) and more. In one exemplary embodiment, the gain medium 102 is configured to have an operating wavelength range 170 of 874-881 nm, as shown in FIG. 5.

The doping concentration and the length of the gain medium 102 are configured to have a desired power output over the operating wavelength range 170. In one embodiment, the gain medium 102 is configured to absorb more than 90% of the pump energy 108, preferably more than 94% of the pump energy 108, within two passes through the end-pumped gain medium 102.

In one embodiment, the doping level is relatively low to allow distribution of the thermal load along the optical axis of the gain medium 102, thereby reducing the thermal stresses induced at the input end 116 (FIG. 1) of the gain medium 102. In one embodiment, the doping concentration of the Nd:YAG gain medium 102 is within a range of about 0.6% to 0.9%. In one embodiment, the gain medium 102 is approximately 100 millimeters long between the first end 116 and the second end 120 and has a diameter of approximately 4.5 millimeters.

By establishing a suitable combination of parameters including the length for the gain medium 102, the doping concentration and the pump energy wavelength, output powers of 10 W to greater than 120 W of frequency converted output 164 at 532 nanometers are readily generated using an Nd:YAG rod about 100 millimeters long and about 4.5 millimeters in diameter with reasonably high quality beam. The technology is scalable to configurations supporting pump energy 108 in the kilowatt range for even higher output beam powers in the primary and harmonic wavelengths for the laser.

As mentioned above, embodiments of the laser system 100 are configured to vary the output power of the laser 112 and, thus, the laser 164, responsive to the power level of the pump energy 108. In one embodiment, the power of the pump energy 108 is quickly switched between first and second power levels. In one embodiment, the difference between the first and second power levels is 5-10 W.

In one embodiment, the power of the pump energy 108 is quickly switched between a low power, which produces a low power primary harmonic laser 112 and a low power second harmonic laser 164, and a high power, which produces a high power primary harmonic laser 112 and a high power second harmonic laser 164. The low power mode may be used to perform a coagulation procedure on a patient and the high power mode may be used to perform a tissue vaporization procedure on a patient, for example.

In one embodiment, there is at least 50 W separating the lower and higher power output laser beams. One embodiment of the lower power output laser beam 164 is within a range of 10-50 W and preferably within a range of 10-30 W. The corresponding low power pump energy 108 may be in the range of 50-300 W, depending on the configuration of the gain medium 102. One embodiment of the high power output laser beam 164 is within a range of 90-150 W, but preferably in a range of 100-120 W. The corresponding high power pump energy 108 may be in the range of 500-1000 W, depending on the configuration of the gain medium 102.

In one embodiment, the power transition between the low power pump energy 108 and the high power pump energy 108 occurs very quickly. In one embodiment, the power transition occurs in less than one second, such as 0.6 seconds, for example.

In one embodiment, the power transition occurs responsive to a power mode setting 180 (FIG. 2) corresponding to an operator input 182 received from an operator of the system 100 through a suitable input device, as mentioned above. Exemplary input devices include a computer input device (e.g., a mouse, a keyboard, etc.), a switch (e.g., a foot-operable switch), or other suitable input device. The controller 130 receives the power mode setting 180 and adjusts the power of the pump energy 108 produced by the laser diodes 122 responsive to the power mode setting 180.

In one embodiment, the multiple power levels are obtained by adjusting the magnitude of the current to the laser diodes 122 from the current source 128 using the controller 130. The current is selected to provide the desired power level of pump energy 108. One disadvantage to this method of controlling the power level of the pump energy 108 is the likelihood of a wavelength shift in the pump energy 108 due to a change in the junction temperature of the laser diodes 122. As a result, this method may require a wide operating wavelength range 170 for the gain medium 102, particularly when quick power changes to the pump energy 108 are desired.

In accordance with another embodiment, each of the plurality of laser diodes 122 has an activated state and a deactivated state. In general, the laser diodes 122 receive an operable current from the current source 128 when in the activated state and do not receive an operable current from the current source 128 when in the deactivated state. The operable current (hereinafter "current") is one having a sufficient magnitude and/or duty cycle (e.g., 20 Hz) to cause the laser diodes 122 to produce a sufficiently usable amount of pump energy for output laser 112 generation purposes. Thus, laser diodes 122 output the pump energy 108 when in the activated state and do not output the pump energy 108 when in the deactivated state.

In one embodiment, the power level of the pump energy 108 and the corresponding power level mode of the pump module 104 are modified by adjusting the number of laser diodes 122 that are in the activated and deactivated states using the controller 130. In one embodiment, the current supplied to the activated laser diodes 122 is constant. As a result, the power level of the pump energy 108 is determined by the subset of the laser diodes 122 that are in the activated state. For instance, the power level of the pump energy 108 can be set to a maximum when all of the laser diodes 122 are set to the activated state and no pump energy 108 is output when all of the laser diodes 122 are set to the deactivated state.

Power level modes between these maximum and minimum power levels are obtained by activating various subsets of the laser diodes 122. For instance, the laser diodes 122 can produce a low power pump energy 108 to generate a low power output laser 112 and laser 164 by placing a small number of laser diodes 122 in the activated state (first power level mode), such as diodes or diode bars $D_1$ and $D_2$, to produce a low power (e.g., 100 watts) pump energy 108 for the generation of a relatively low power (e.g., 30 watts) laser 112 and laser 164. Similarly, the controller 130 can activate a larger subset of the plurality of the laser diodes 122 (second power level mode) including all of the laser diodes 122 to provide a higher power (e.g., 500-1000 watts) pump energy 108 to produce a high power (e.g., >100 W) output laser 112 and laser 164.

One significant advantage of this embodiment of the pump module 104 is the ability to maintain the wavelength of the pump energy 108 within a tighter range during quick power adjustments to the pump energy 108 than is possible when the entire set of the laser diodes 122 is maintained in the activated state and the current to all of the laser diodes 122 is adjusted to produce the desired pump energy 108 power level. This is due to the ability to maintain a constant level of current to each activated laser diode using the current source 128.

The activation and deactivation of the laser diodes 122 provides a coarse power adjustment to the pump energy 108 while the current to the laser diodes 122 remains substantially constant. This can provide a minimum power adjustment equal to the power output from a single laser diode 122. For instance, if the laser diodes 122 are each 10 W diodes, coarse power adjustments of 10 W can be made by activating or deactivating a single laser diode 122. In one embodiment, fine power adjustments are made to the pump energy 108 by adjusting the current to the activated laser diodes 122, such as by adjusting the current output from the current source 128 using the controller 130 (FIG. 2), for example. In this manner, power adjustments of less than the power output from a single laser diode 122 can be made, such as adjustments of less than 5 W. As a result, one embodiment of the pump module 104 is capable of providing a near continuous power adjustment of the pump energy 108 through the activation or deactivation of the laser diodes 122 and through the adjustment of the current to the activated laser diodes 122.

Figure 7:
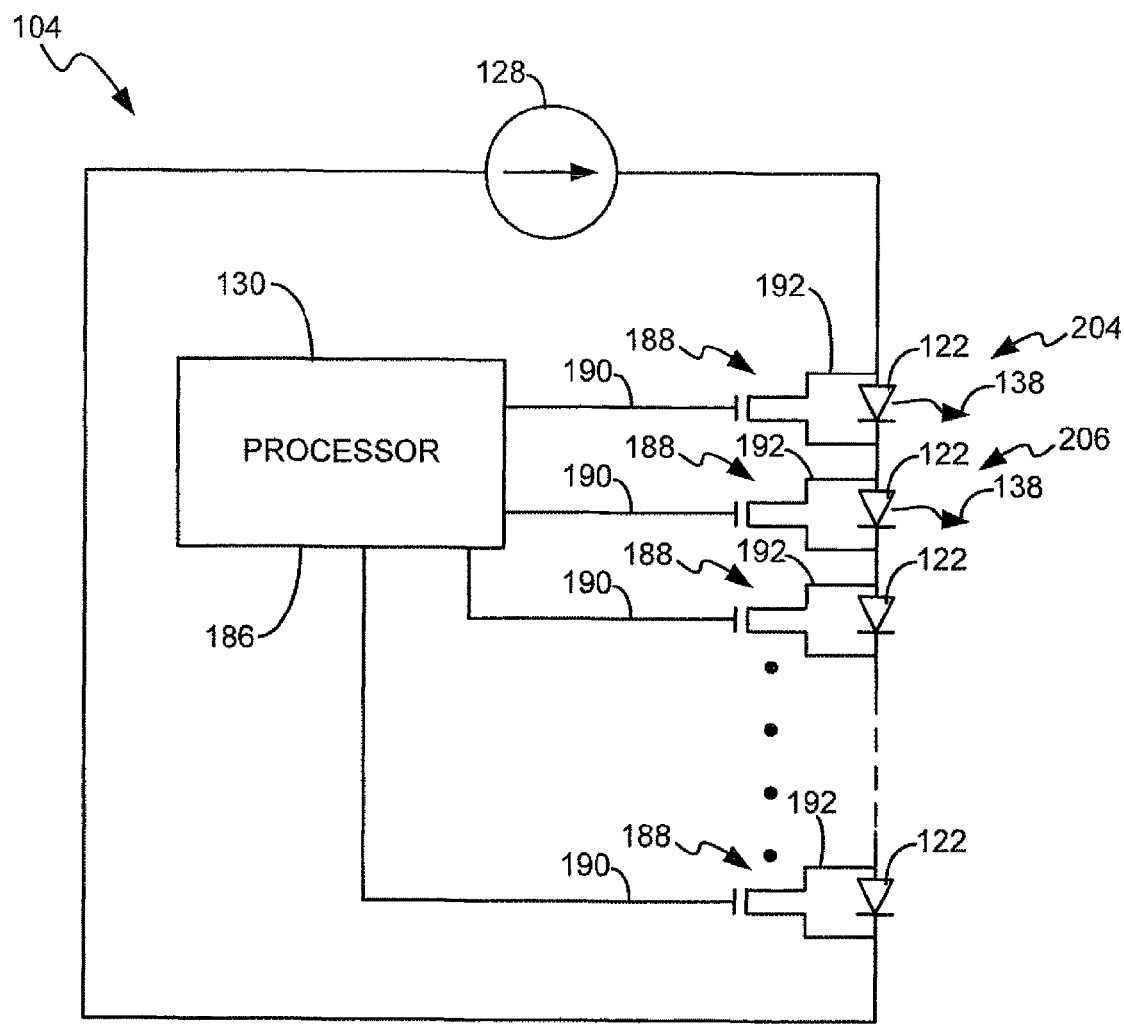
FIG. 7 is an exemplary simplified circuit diagram for switching laser diodes of the pump module between activated and deactivated states in accordance with embodiments of the invention.

FIG. 7 is a simplified circuit diagram illustrating an exemplary technique that can be used to switch the laser diodes 122 between the activated and deactivated states. Depicted in the exemplary circuit diagram are the laser diodes or diode bars 122, the current source 128 and a processor 186, which is a component of the controller 130. In one embodiment, the processor 186 receives the power mode setting 180 or other instruction, which may be based on the power mode setting 180. The processor 186 adjusts the number of diodes 122 that are in the activated state based on the power mode setting 180.

In the exemplary circuit diagram of FIG. 7, the individual diodes 122 are activated or deactivated through the appropriate setting of a switch 188, such as, for example, a MOSFET or other transistor, responsive to a signal on a corresponding line 190 from the processor 186 that is coupled to the gate of the MOSFET. For instance, when the line 190 is pulled to a "high" voltage level, current travels from the current source 128 along route 192, which bypasses the corresponding diode 122 due to the forward voltage drop that must be overcome for the current to pass through the diode 122. Current is thereby prevented from passing through the diode 122 and the diode is, therefore, in the deactivated state. Individual diodes 122 are placed in the activated state by pulling the line 190 to a "low" voltage level using the processor 186, which prevents the flow of current through path 192. The current from the current source 128 is routed through the corresponding diode 122 to place it in the activated state and cause the diode to produce the light 138. Thus, the processor 186 (i.e., controller 130) can place the individual laser diodes 122 in the activated or deactivated state through the control of the voltage on lines 190.

Different power levels can then be easily achieved based on the selected subset of the laser diodes 122 that is placed in the activated state. For instance, when the laser diodes 122 are 25 W diodes, a 500 W pump energy level can be achieved by placing twenty of the laser diodes 122 in the activated state. Higher and lower power pump energies 108 are achieved through the activation of larger or smaller subsets of the available laser diodes 122, using the controller 130.

Figure 8:
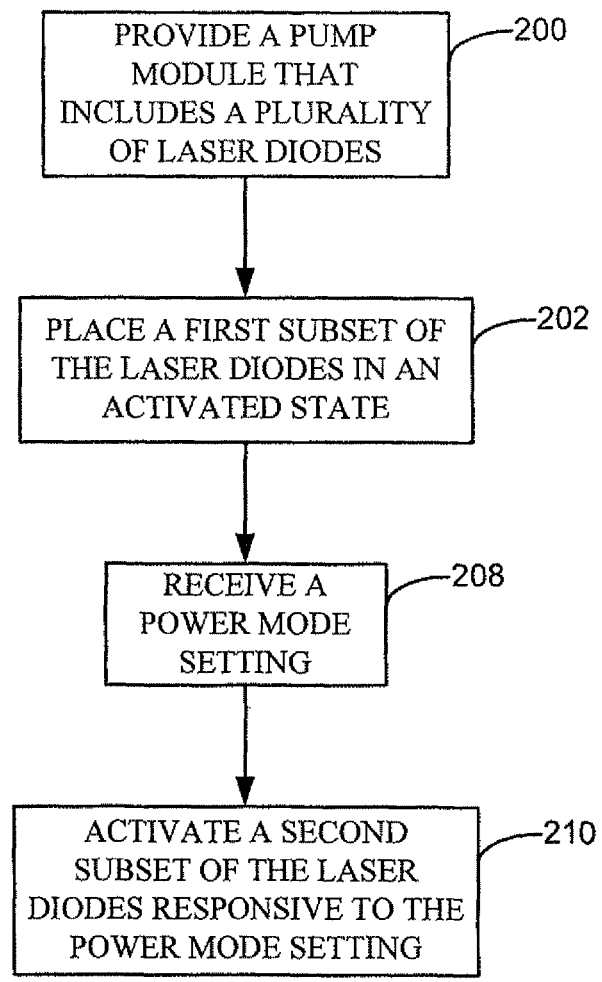
FIG. 8 is a flowchart illustrating a method of generating pump energy for use in a laser system in accordance with embodiments of the invention.

Another embodiment of the invention is directed to a method of generating pump energy 108 for use in a laser system 100 at multiple power levels, a flowchart of which is illustrated in FIG. 8. In one embodiment, a pump module 104 is provided at 200, such as the pump module 104 formed in accordance with applicable embodiments described above with reference to FIGS. 1-4 and 7. In one embodiment, the provided pump module 104 includes a current source 128, a plurality of laser diodes or diode bars 122, light combining optics 124, and a controller 130. At 202, the controller 130 places a first subset of the laser diodes 122 in an activated state, such as diodes 204 and 206 in FIG. 7, in which they receive current from the current source and produce light 138. The light 138 from the diodes 204 and 206, which is combined and output as pump energy 108 by the light combining optics 124 at a first power level to generate the output laser 112 and laser 164 at a first power level. In one embodiment, the controller 130 receives a power mode setting 180, which is indicative of the first power mode, such as from an operator, and activates the first subset of the laser diodes 122 responsive to the power mode setting 180.

At 208, a power mode setting 180 in accordance with the embodiments described above is received that is indicative of a second power mode. At 210, the controller 130 activates a second subset of the laser diodes 122 responsive to the power mode setting 180 to place the laser diodes 122 in the second power mode. The light 138 output from the activated laser diodes 122 is combined and output as pump energy 108 using the light combining optics 124 at a second power level to generate the laser 112 and laser 164 at a second power level.

In one embodiment, the first power level is lower than the second power level. Accordingly, the first subset of the laser diodes 122 includes fewer laser diodes 122 than the second subset. In another embodiment, the first power level is greater than the second power level. As a result, the first subset is larger than the second subset.

In summary, embodiments include a method of generating pump energy 108 for use in a laser system 100 having multiple power levels comprising: providing a pump module 104 comprising a plurality of laser diodes 122, a current source, light combining optics 124 and a controller 130; activating a first subset of the laser diodes 122 using the controller 130 (first power mode); combining light generated by the activated first subset of laser diodes 122 and outputting pump energy 108 at a first power level using the light combining optics 124; receiving a power mode setting 180; switching the power level to a second power level responsive to the power mode setting 180 comprising activating a second subset of the laser diodes 122 using the controller 130; and combining light 138 generated by the activated second subset of laser diodes 122 and outputting pump energy 108 at a second power level using the light combining optics 124.

Figure 9:
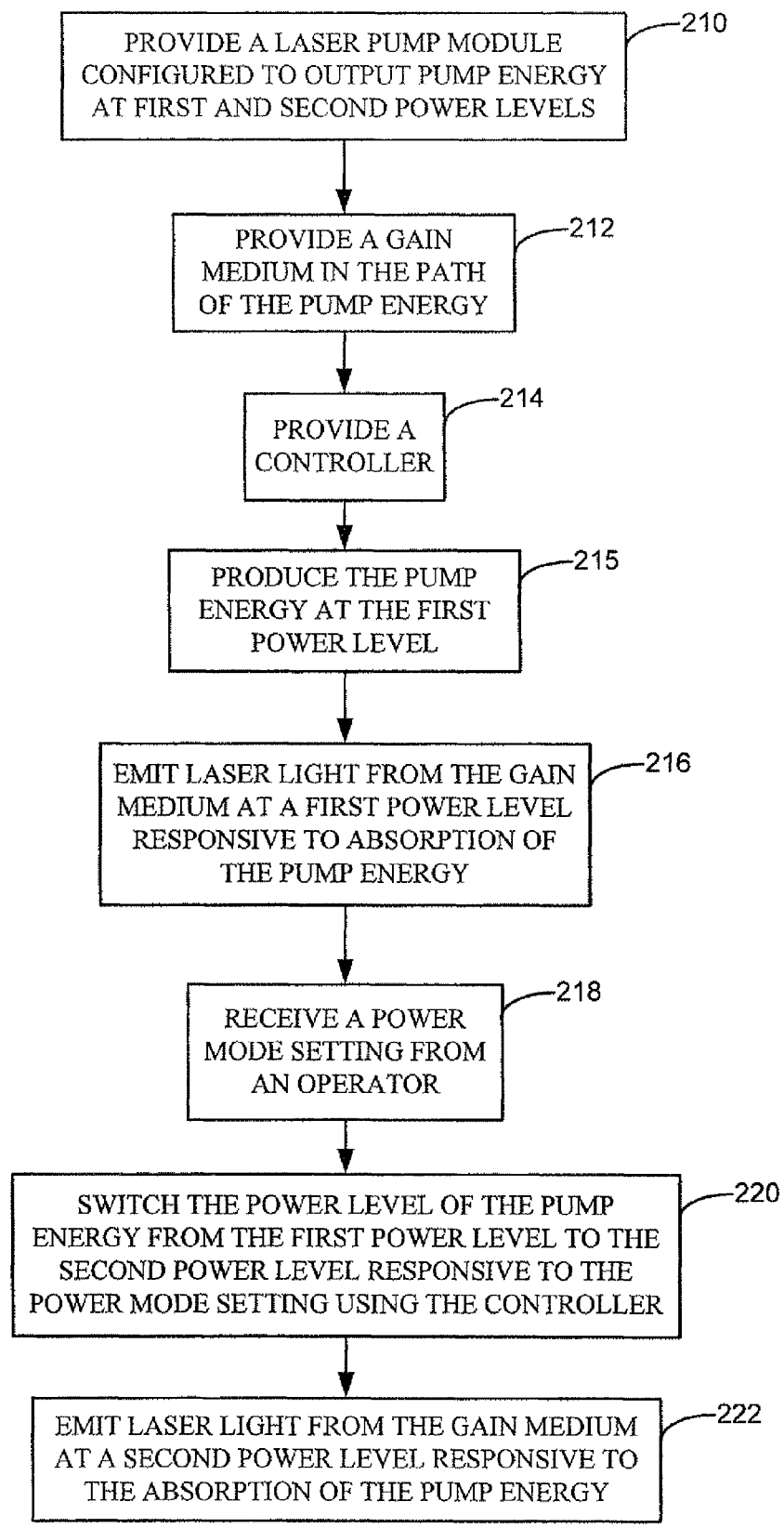
FIG. 9 is a flowchart illustrating a method of generating laser output beams having multiple power levels in accordance with embodiments of the invention.

Another embodiment is directed to a method of generating laser output beams having multiple power levels, a flowchart of which is illustrated in FIG. 9. Each of the components used in the method are formed in accordance with any one of the applicable embodiments described above. At 210, a laser pump module 104 is provided that is configured to output pump energy 108 at first and second power levels, wherein the wavelength of the pump energy 108 is within a range of 874-881 nm at the first and second power levels. A gain medium 102 is provided in the path of the pump energy 108 (FIG. 1) and a controller 130 is provided at 212 and 214. At 215, pump energy 108 is produced at the first power level using the pump module 104. At 216, an output laser 112 is emitted from the gain medium 102 at a first power level responsive to absorption of the pump energy 108. A power mode setting 180 is received from an operator, at 218. At 220, the power level of the pump energy 108 is switched from the first power level to a second power level responsive to the power mode setting 180 using the controller 130. At 222, laser light 112 is emitted from the gain medium 102 at a second power level responsive to the pump energy 108. The first and second power levels of the laser light 112 can respectively be used to produce output laser 164 at first and second power levels.

Although the present invention has been described with reference to preferred embodiments, workers skilled in the art will recognize that changes may be made in form and detail without departing from the spirit and scope of the invention.

What is claimed is:

1. A method comprising:
activating a laser pump module comprising:
a plurality of laser diodes including a first diode subset and a second diode subset;
a gain medium with an operating wavelength range;
a temperature control system; and
a controller operable with the plurality of diodes and the temperature control system;
selectively enabling, with the controller, a first current to the first diode subset;
outputting, from the laser pump module, a first pump energy with a first operating wavelength and a first power level of 10-50 W;
selectively enabling, with the controller, a second current to the second diode subset;
outputting less than one second after the first pump energy, from the laser pump module, a second pump energy with a second operating wavelength at a second power level; and
adjusting, with the controller and the temperature control system, (i) a magnitude of the first or second current and (ii) an operating temperature of the plurality of laser diodes to maintain the first and second operating wavelengths within the operating wavelength range of the gain medium,
wherein the first pump energy is different that the second pump energy, there is at least 50 W separating the first and second power levels, and the operating wavelength range of the gain medium includes the first and second operating wavelengths.

2. The method of claim 1, wherein the gain medium comprises a yttrium-aluminum-garnet (YAG) crystal rod with neodymium atoms dispersed in the YAG rod.

3. The method of claim 2, wherein:
the operating wavelength range of the gain medium is 874-881 nm; and
the absorption coefficient of the gain medium within the operating wavelength range of 874-881 nm is greater than 90%.

4. The method of claim 1, wherein the laser pump module includes an input device, and the method further comprises:
receiving inputs through the input device, and
directing or adjusting the first or second currents based on the inputs.

5. The method of claim 4, wherein the input device comprises a switch.

6. The method of claim 1, wherein the laser pump module includes a power source, and the selectively enabling steps comprise directing, with the controller, the first or second currents from the power source to the respective first or second diode subsets.

7. The method of claim 1, wherein each of the plurality of laser diodes is a 10 W diode, and selectively enabling the first or second currents flowing to the respective first or second diode subsets comprises adjusting the respective first or second power levels in increments of approximately 10 W.

8. The method of claim 1, wherein adjusting the magnitude of the first or second current comprises adjusting the respective first or second power levels by less than approximately 10 W.

9. The method of claim 1, further comprising:
generating a first laser light from the first pump energy; and
generating a second laser light from the second pump energy.

10. The method of claim 9, further comprising:
performing a coagulation procedure with the first laser light; and
performing a vaporization procedure with the second laser light.

11. A method comprising:
powering a laser pump module comprising: a controller, a power source, a gain medium with an operating wavelength range, a plurality of laser diodes, and a temperature control system;
selectively enabling, with the controller, a first current flowing from the power source to at least one laser diode of the plurality of laser diodes;
outputting a first pump energy from the laser pump module at a first operating wavelength and a first power level of at least 10 W;
selectively enabling, with the controller, a second current flowing from the power source to at least one other laser diode of the plurality of laser diodes;
outputting, less than one second after the first pump energy, a second pump energy from the laser pump module at a second operating wavelength and a second power level; and
adjusting, with the controller and the temperature control system, (i) a magnitude of the first or second currents and (ii) an operating temperature of the plurality of laser diodes to maintain the first or second operating wavelengths within the operating wavelength range of the gain medium,
wherein the first pump energy is different that the second pump energy, there is at least 50 W separating the first and second power levels, and the operating wavelength range of the gain medium includes the first and second operating wavelengths.

12. The method of claim 11, wherein each laser diode of the plurality of laser diodes is a 10 W diode, and selectively enabling the second current comprises adjusting the second power level in increments of approximately 10 W.

13. The method of claim 12, wherein adjusting the magnitude of the first or second currents includes adjusting the second power level by less than approximately 10 W.

14. The method of claim 11, wherein the gain medium comprises a crystal rod.

15. The method of claim 14, wherein:
the operating wavelength range of the gain medium is 874-881 nm; and
the absorption coefficient of the gain medium within the operating wavelength range of 874-881 nm is greater than 90%.

16. A method comprising:
configuring a laser pump module comprising: a controller, a power source, a gain medium, a plurality of laser diodes, and a temperature control system;
selectively enabling, with the controller, a first current flowing from the power source to at least one of the plurality of laser diodes;
outputting, from the laser pump module, a first pump energy at a first operating wavelength and a first power level;
directing, with the controller, a second current to at least one more laser diode of the plurality of laser diodes;
outputting less than one second after the first pump energy, from the laser pump module, a second pump energy at a second operating wavelength and a second power level; and
adjusting, with the controller, (i) a magnitude of the first or second current and (ii) an operating temperature of the plurality of laser diodes to maintain the first and second operating wavelengths within an operating wavelength range of the gain medium,
wherein the first pump energy is different that the second pump energy, and there is at least 50 W separating the first and second power levels.

17. The method of claim 16, wherein:
the operating wavelength range of the gain medium is 874-881 nm; and
the absorption coefficient of the gain medium within the operating wavelength range of 874-881 nm is greater than 90%.

18. The method of claim 16, further comprising:
generating a first laser light from the first pump energy; and
generating a second laser light from the second pump energy.

19. The method of claim 18, further comprising:
performing a coagulation procedure with the first laser light; and
performing a vaporization procedure with the second laser light.

* * * * *